United States Patent [19]
Munemasa et al.

[11] Patent Number: 5,859,500
[45] Date of Patent: Jan. 12, 1999

[54] METAL ION PLASMA GENERATOR HAVING ROTATABLE ANODE PLATE

[75] Inventors: Jun Munemasa, Takasago, Japan; Alexander Elkind; James R Treglio, both of San Diego, Calif.

[73] Assignees: Kabushiki Kaisha Kobe Seiko Sho, Kobe, Japan; ISM Technologies, Inc., San Diego, Calif.

[21] Appl. No.: 908,981

[22] Filed: Aug. 8, 1997

[51] Int. Cl.⁶ .................................................. H05H 1/00
[52] U.S. Cl. ............................ 315/111.21; 315/111.81
[58] Field of Search .................. 250/423 R, 427; 118/723 E, 723 ER, 720, 722, 319; 204/298.07, 298.05, 298.04, 298.02; 315/111.21, 111.81, 111.31, 111.41, 111.51, 111.61, 111.71

[56] References Cited
U.S. PATENT DOCUMENTS 4,714,834  12/1987  Shubaly ................................ 250/427
5,071,670  12/1991  Kelly ..................................... 427/38

*Primary Examiner*—Don Wong
*Assistant Examiner*—David H. Vu
*Attorney, Agent, or Firm*—Oblon, Spivak, McClelland, Maier & Neustadt, P.C.

[57] ABSTRACT

In an apparatus in which a vacuum-arc discharge is generated between a metal cathode and anode plate and an evaporated substance from the cathode is supplied through openings on the anode plate, conventionally, a cleaning work to remove metal films deposited on the edges of the openings has to be done periodically, which limits continuous operation. The apparatus relating to the invention is provided with a rotary anode plate 14 on which a plurality of openings 17 are formed on a circumference concentric with the rotary axis of the anode plate. As the anode plate 14 rotates, the openings 17 are designed to come into a position to face the cathode. This construction can continue a longer operation with an extremely low deterioration of the performance without a maintenance work requiring a relief of the vacuum.

5 Claims, 6 Drawing Sheets

F I G. 2
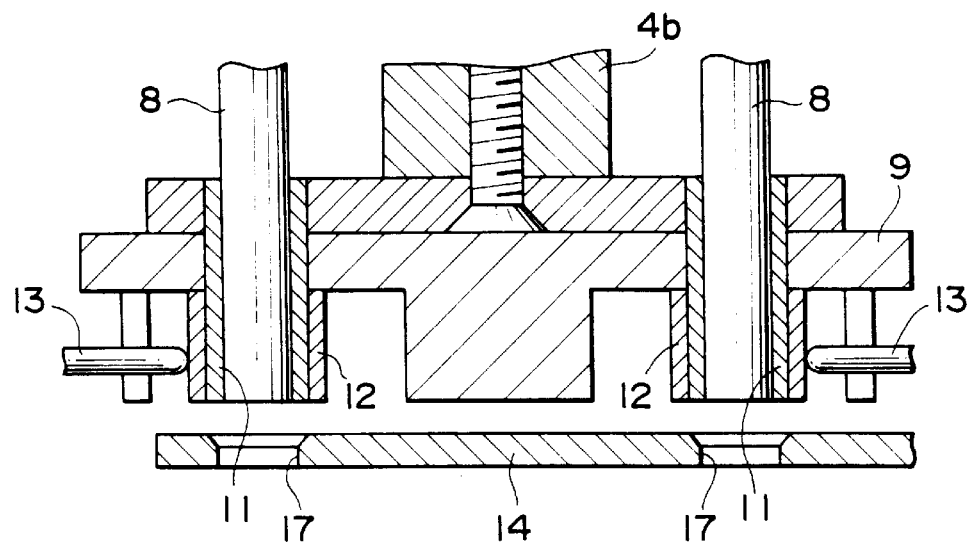
F I G. 3
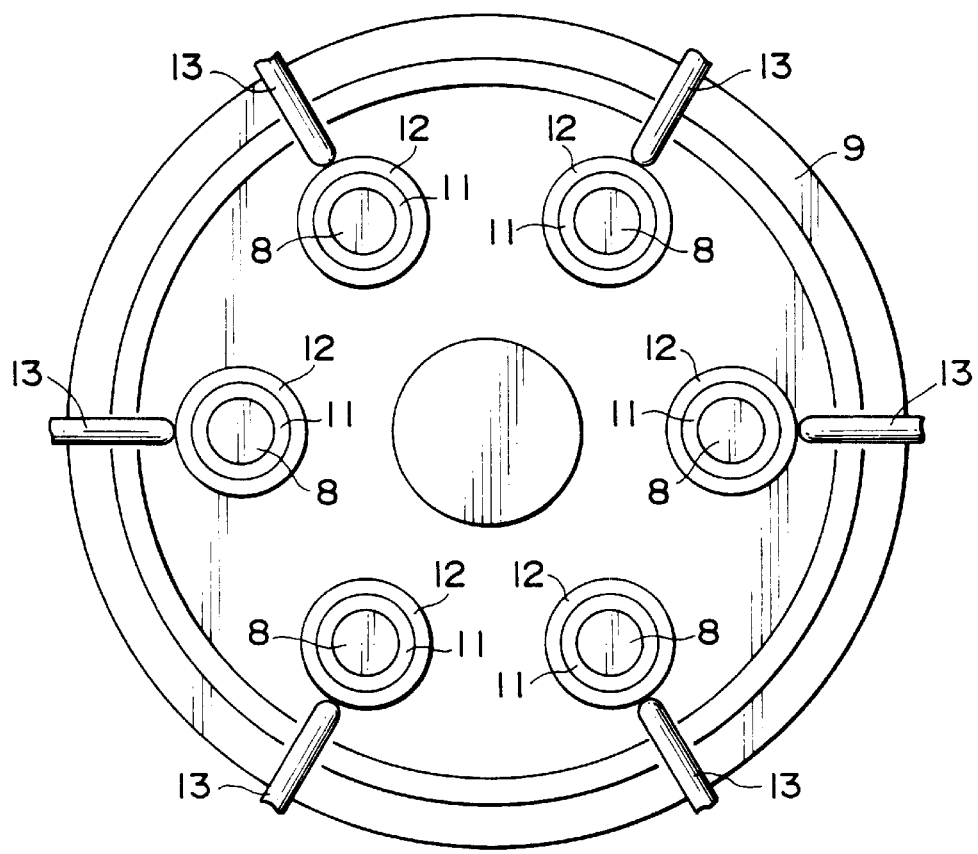

5,859,500

METAL ION PLASMA GENERATOR HAVING ROTATABLE ANODE PLATE

BACKGROUND OF THE INVENTION

1. Field of the Invention

The present invention relates to a metal ion plasma generator that produces a metal ion plasma by vaporizing a metal cathode by means of a vacuum-arc discharge.

2. Description of the Background Art

An apparatus shown in FIG. 8 is known which produces the metal ion plasma by the vacuum-arc discharge, in which the apparatus is composed of a metal cathode 52 of a bar-form and an anode plate 53 of a plate-form in a vacuum chamber 51 (refer to a disclosure in JP-A-63-276858). The cathode 52 has an axis perpendicular to the anode plate 53 and is supported by a cathode holder 54, The anode plate 53 has an opening 55 which is coaxial with and faces with a space to the cathode 52.

The front end part projected from the cathode holder 54 is sheathed by an insulator ring 56 made of an insulating material. And, the insulating ring 56 is further sheathed by a trigger ring 57 made of a conductive material, and a trigger electrode 58 is guided inside the vacuum chamber 51 so as to touch the outer surface of the trigger ring 57.

In the foregoing construction, applying a high pulse voltage between the trigger ring 57 and the cathode 52 through the trigger electrode 58 will generate a trigger discharge. And then, applying a specific voltage between the anode plate 53 and the cathode 52 will generate a vacuum-arc discharge between the anode plate 53 and the cathode 52, whereby the foregoing trigger discharge is served as a starter. A point called arc spot where energy is locally concentrated emerges at the front end part of the cathode 52 through this vacuum-arc discharge. This part vaporizes and ionizes to produce a metal ion plasma. This metal ion plasma is guided through the opening 55 of the anode 53 to a processing room (not illustrated) connecting with the foregoing vacuum chamber 51.

When the foregoing apparatus is used for forming a thin film, the foregoing metal ion plasma is supplied on a substrate disposed in the processing room. And, when the foregoing apparatus is used for a metal ion source, the foregoing metal ion plasma is supplied to an ion pullout electrode provided inside the processing room.

As shown in FIG. 9(a), a part of the metal ion plasma Mv flowing through the opening 55 of the anode plate 53 deposits at the edge of the opening 55, growing a metal film Mf, presenting the so-called "built-up" phenomenon as shown in FIG. 9(b). This deposition reduces the diameter of the opening 55 and the passage ratio of the metal ion, and consequently it deteriorates the characteristics of the arc source.

Further as shown in FIG. 9(c), when the forgoing metal film Mf grows thick enough to electrically short the anode plate 53 and the cathode 52, the vacuum-arc discharge stops and the operation cannot be continued. And, the short-circuit between the anode plate 53 and the cathode 52 will give a latent damage to electric components on the power supply line. Therefore conventionally, after a certain hour of continuous operation, before the short-circuit between the anode plate 53 and the cathode 52 is produced, the whole apparatus is periodically shut down to restore air pressure in the vacuum chamber 51. And, a cleaning work is done to mechanically remove a film deposited on the anode plate 53. The continuous operation hour is generally set on the basis of experiment results. The reason is that the deposition rate of the metal film Mf is different depending on the material of the metal cathode.

However, the foregoing conventional apparatus needs a frequent cleaning work to remove deposited films after restoring air pressure in the vacuum chamber 51, which reduces a continuous operation time; consequently, a sufficient productivity cannot be achieved when, for example, a thick film coating or an ion-implantation requiring a high implantation density is done. And, a maintenance work becomes complicated which takes out the anode plate 53 from the vacuum chamber 51 and removes a metal film on the periphery of the opening 55 using, for example, a grinder.

SUMMARY OF THE INVENTION

The present invention has been made in view of the foregoing problems of the conventional apparatus, and it is an object of the present invention to provide a metal ion plasma generator that does not need to relieve vacuum and enables a longer continuous operation so as to enhance productivity and workability.

In order to accomplish the aforementioned object, in a metal ion plasma generator in which a vacuum-arc discharge is generated inside a vacuum chamber between a metal cathode and an anode plate and an evaporated substance from the cathode is supplied through an opening on the anode plate located at a position facing to the cathode, the metal ion plasma generator according to the present invention is characterized in that the anode plate is rotatably provided, a plurality of openings are formed on a circumference of the anode plate so as to be concentric with the rotary axis of the anode plate, and a rotation driving means for rotating the anode plate from outside of the vacuum chamber is provided so as to sequentially locate these openings to a position facing to the cathode with the rotation of the anode plate.

Owing to this construction, when a metal film is deposited at the edge of an opening facing to the cathode with a continuous operation, rotating the anode plate can position another opening face to face with the cathode to resume the operation in this state, and a metal ion plasma can be supplied through a new opening on which a metal film is not deposited. This operation of rotating the anode plate can be repeated as many times as the number of the openings provided on a circumference on the anode plate, during which a maintenance work is not needed that the air pressure is required to be restored in the vacuum chamber, and a longer operation can be continued which does not degrade the performance.

Furthermore, the aforementioned anode plate may be constructed with a body plate rotatably attached to the vacuum chamber and a bored plate detachable from the body plate, on which the foregoing openings are formed.

In such a construction, it is not necessary to take out whole the anode plate from the vacuum chamber in a maintenance work when metal films are deposited on the edges of all the openings, but it only needs to remove a smaller bored plate from the body plate. Still more, preparing a surplus bored plate and exchanging for a new one spares a work to remove deposited metal films mechanically by a grinder or the like, thereby improving the work efficiency.

Furthermore, if a board member is provided on the locus on which the openings move with the rotation of the anode plate, so as to come into contact with the surface of the anode plate; when an opening turns to cross the board member, the board member rakes off metal films deposited on the periphery of the opening. Thereby, the openings where metal films are once formed can be reused. Consequently, a still longer operation can be continued.

And, preferably the aforementioned board member is formed of a conductive elastic material, electrically connected to the anode plate, and one end of the board member is attached to an anode flange facing to the anode plate and enclosing the vacuum chamber.

In this construction, attaching the foregoing board member formed of an elastic material with an elastic deformation so as to induce a pressing force to the surface of the anode plate will ensure the raking-off described above. Moreover, since the foregoing board member has conductivity, a good electrical contact is given between the anode plate and the anode flange through this board member. This construction can maintain the anode plate and the anode flange in the same potential more reliably, which enables an operation that electrical losses between the anode plate and the anode flange are sufficiently reduced.

And, preferably a collecting case for collecting particles removed by the board member from the surface of the anode plate is provided on a position in a dropping direction of the particles.

Providing such a collecting case prevents metal particles raked off by the board member from flying about in the vacuum chamber. This facilitates the maintenance work to clean the vacuum chamber, thereby improving the workability.

BRIEF DESCRIPTION OF THE DRAWINGS

The present invention will be fully understood from the detailed description given below and from the accompanying drawings of the preferred embodiment of the invention, which, however, should not be taken to limit the specific embodiment, but are for explanation and understanding, in which:

FIG. 2 is an enlarged sectional view showing a construction of an end part of a cathode in the foregoing generator;

FIG. 3 is a plan view showing the layout of the foregoing cathode, viewing from the bottom;

FIG. 9 shows operating states in the generator shown in FIG. 8, wherein

DESCRIPTION OF THE PREFERRED EMBODIMENT

With reference to the accompanying drawings, one embodiment of the present invention will hereafter be described.

Figure 1:
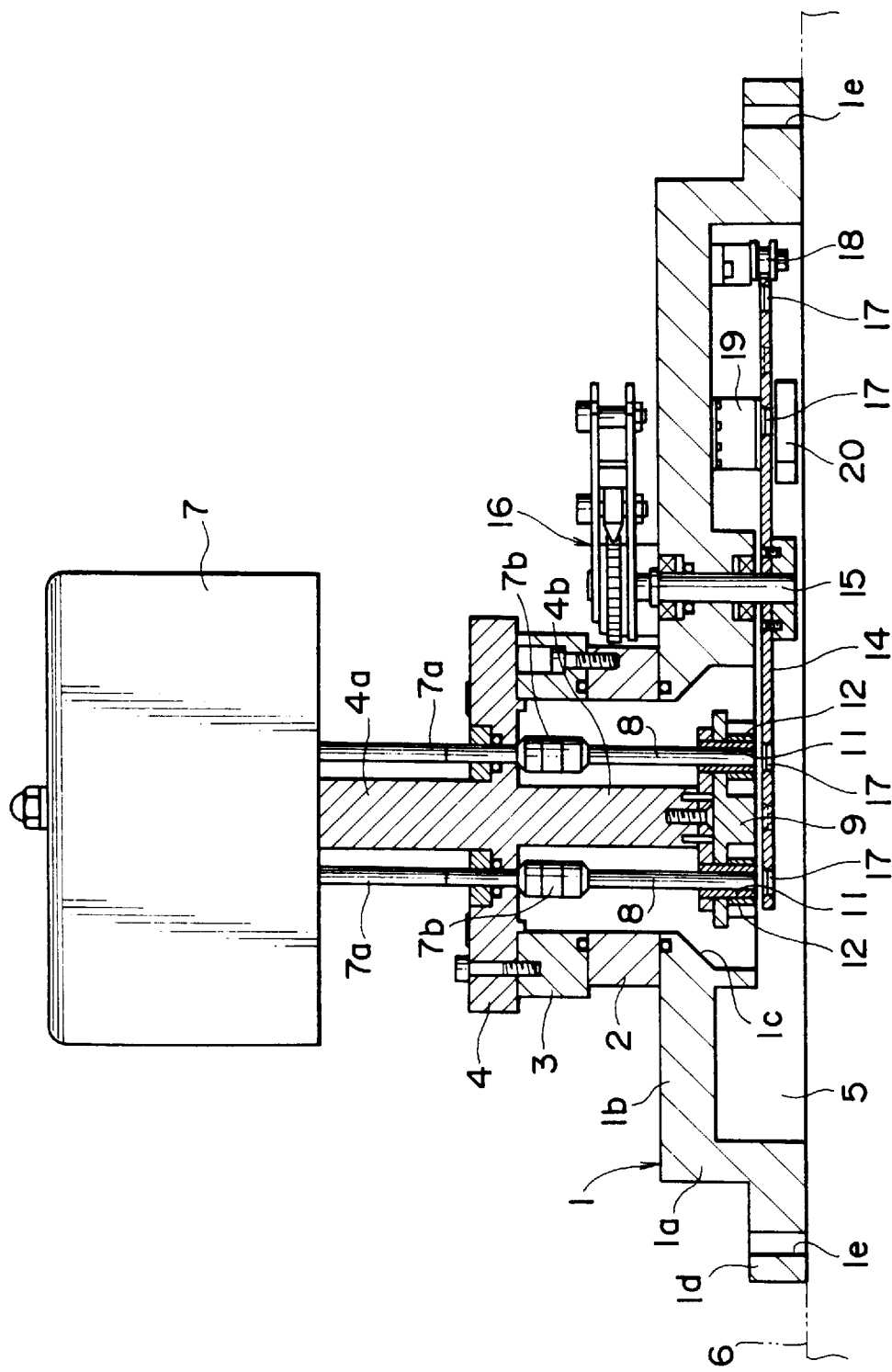
FIG. 1 is a sectional view of a metal ion plasma generator of one embodiment according to the present invention.

As shown in FIG. 1, the metal ion plasma generator of this embodiment is provided with a comparatively low base housing 1 on the bottom side. This base housing 1 is formed of a cylindrical wall 1a and an upper wall 1b covering the top of this cylindrical wall 1a. On the upper wall 1b at a slightly left side to the center in the drawing is formed an opening 1c, on the circumferential edge of this opening 1c a lower cylindrical wall 2 and an upper cylindrical wall 3 are hermetically attached which are both made of insulating materials, Further, on the top of the upper cylindrical wall 3 is hermetically attached a lid 4 to cover the opening, and inside, these members 1, 2, 3, 4 forms an enclosed vacuum chamber 5.

When this metal ion plasma generator is used, a processing apparatus 6 such as an ion implantation apparatus or a thin film forming apparatus is hermetically connected to the base housing. For this purpose, the base housing 1 is provided with a flange 1d which is connected to the bottom periphery of the cylindrical wall 1a to extend outwardly, and a plurality of holes 1e . . . for inserting bolts are formed on this flange 1d.

On a central position of the foregoing lid 4, an upper shaft 4a extending upward and a lower shaft 4b extending downward are connected on each upper and lower side of the lid 4. On the upper end of the upper shaft 4a is attached a cathode drive unit 7 that contains a cathode transfer mechanism for driving a cathode 8 (described later) in the axial direction. This cathode drive unit 7 is provided with a plurality of cathode holding bars 7a . . . and lower sides of these cathode holding bars 7a . . . each are hermetically put through the lid 4. Lower ends of these cathode holding bars 7a . . . each are coaxially connected to the aforementioned bar-shaped metal cathodes 8 . . . through connecting parts 7b . . .

On the other hand, a radially extending holding member 9 is attached on the bottom of the lower shaft 4b of the lid 4. Cylindrical insulating rings 11 . . . made of a ceramic material or the like are fixed to this holding member 9. These insulating rings 11 . . . each are located at corresponding positions to the foregoing connecting parts 7b . . . as shown in FIG. 2. The lower sides of the cathodes 8 . . . each are fit in the insulating rings 11 . . . , and supported such that the lower end surface of each cathode is substantially flush with the edge surface of the corresponding insulating ring 11.

Furthermore, the outer surface of the lower side of each insulating ring 11 is sheathed with each of trigger rings 12 . . . made of a conductive material. The edge surface of each trigger ring 12 is substantially flush with the edge surface of each insulating ring 11. Each of front ends of bar-form trigger electrodes 13 . . . touches the surface of each of trigger rings 12 . . . These electrodes are put through the aforementioned base flange 1 into the vacuum chamber 5. A trigger pulse voltage (described later) is applied to each of the trigger rings 12 . . . through each of the trigger electrodes 13 . . .

Further in this embodiment, six cathodes 8 . . . are constructed so as to be supported each in parallel in the vacuum chamber 5. In this case, the edge surfaces of these six cathodes 8 . . . each are placed circumferentially in equal distance, that is, so as to be located at the summits of an orthohexagon (the lay-out of the edge surfaces of these cathodes is hereafter called the cathode configuration).

As shown in FIG. 1, inside the vacuum chamber 5, a circular anode plate 14 orthogonal to the cathode 8 is disposed with a specific distance under each of the edge surfaces of the cathodes 8 . . . supported as described above.

In order to support this anode plate 14 in the vacuum chamber 5, a rotary shaft 15 hermetically transfixed through the upper wall 1b of the base housing 1 is provided on a slightly right side to the center of the base housing 1. The upper end of this rotary shaft 15 is connected to a rotary drive mechanism (rotary drive means) 16 attached on the upper wall 1b. This mechanism 16 turns the foregoing rotary shaft 15 intermittently by a specific angle. On the lower end part of the rotary shaft 15, the anode plate 14 is fixed concentrically.

Multiple openings 17 are formed on the anode plate 14, and each of the openings has a slightly larger diameter than the cathodes 8. The configuration of these openings 17 will be described with reference to FIG. 4.

Figure 4:
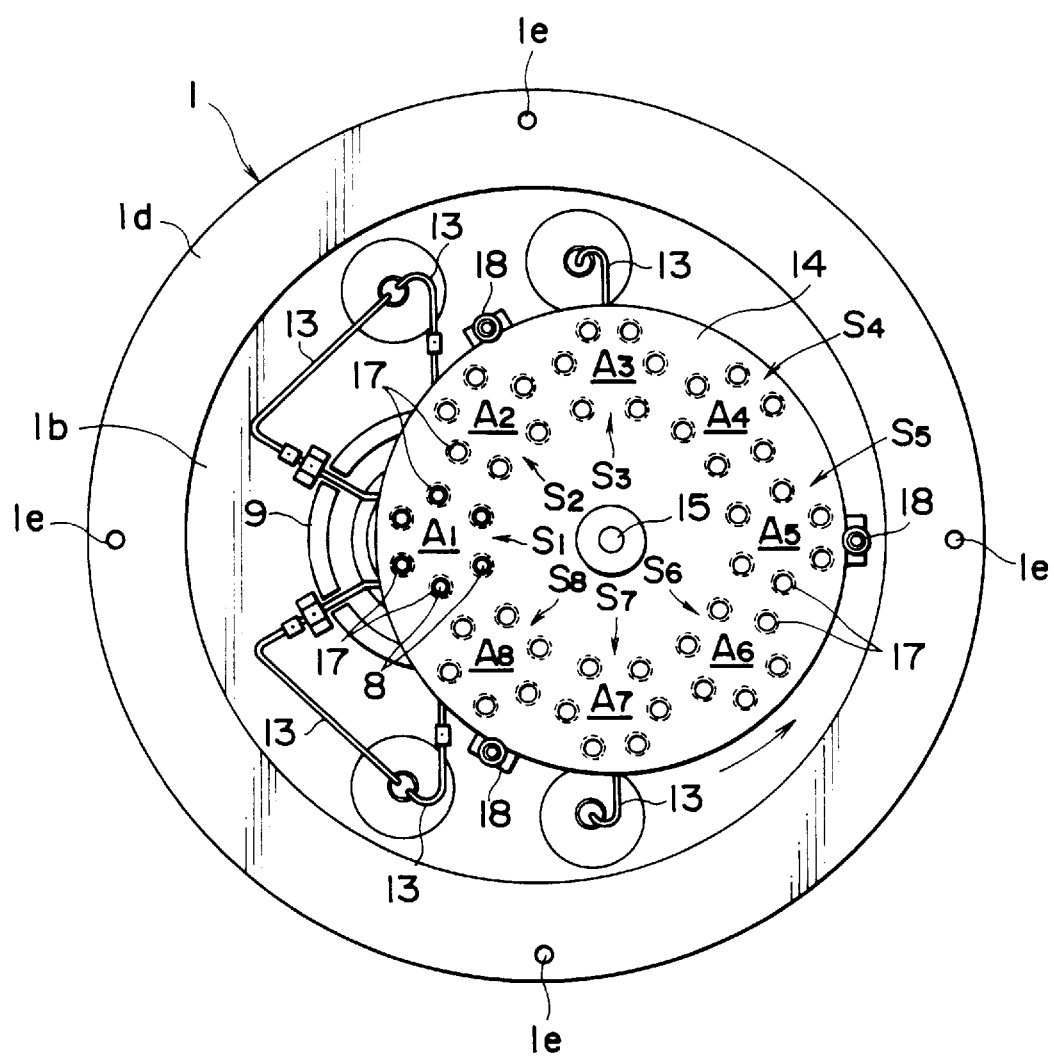
FIG. 4 is a plan view showing an inner construction of the foregoing generator, viewing from the bottom.

In FIG. 4, the edge surfaces of six cathodes 8 . . . are shown by the mark, which are seen from the bottom side through the openings 17 . . . in a peripheral area A1 on the left side of the anode plate 14 in the drawing. That is, six openings 17 . . . with the same configuration as the aforementioned cathode configuration are formed in this peripheral area A1. Assuming a concentric circle that has the same axis as the axis of the rotary shaft 15 and passes the center of the six openings 17 . . . , the six openings 17 . . . are formed each by 45° on this concentric circle. Namely, the six openings 17 . . . with the same configuration as the foregoing cathode configuration are formed on peripheral areas A2~A8 which are apart each by 45° from the area A1 on the concentric circle. The six openings 17 . . . on the peripheral area A1~A8 are hereinafter called the first hole set S1, second hole set S2, . . . , eighth hole set S8, respectively, for the purpose of explanation.

The foregoing anode plate 14 is intermittently driven to rotate by 45°, for example, counterclockwise in the drawing by the aforementioned rotation drive mechanism 16. When this rotary operation makes a 45° turn from the state shown in FIG. 4, the first hole set S1 is switched to the second hole set S2 formed on the peripheral area A2, and each of the six openings 17 . . . of the second hole set comes into a position to face each of the cathodes 8 . . . (hereinafter, discharge area). Further, the rotary shaft 15 drives to switch to the third hole set S3, fourth hole set S4 , . . . , so that each of the openings 17 . . . comes into the corresponding position to each of the cathodes 8.

In FIG. 4, six trigger electrodes 13 . . . are shown which transfix the upper wall 1b. Each front end of these trigger electrodes 13 . . . is disposed so as to touch each of the outer surfaces of the trigger rings 12. Guide rollers 18 . . . are provided at three positions along the circumference of the anode plate 14. These guide rollers 18 . . . restrict a run-out by the rotation of the anode plate 14, which maintains to put each of the openings 17 . . . to the correct position to each of the cathodes 8 . . .

Figure 5:
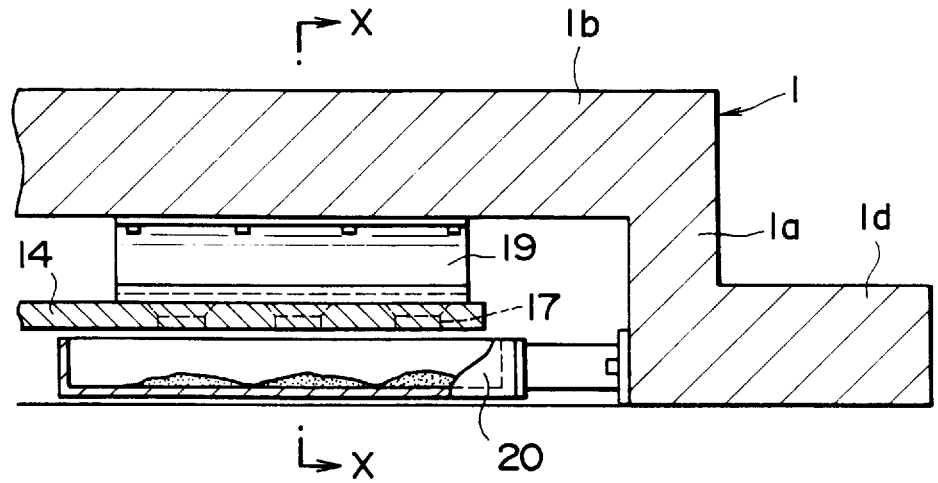
FIG. 5 is an enlarged sectional view showing a peripheral area of an anode plate in the foregoing generator.
Figure 6:
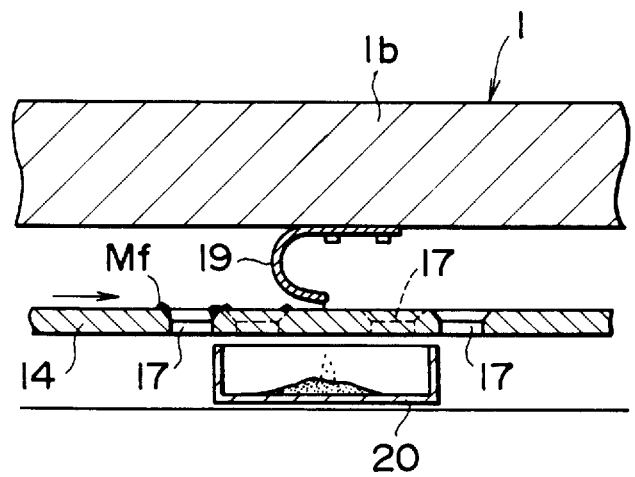
FIG. 6 is a sectional view taken on by the line X—X in FIG. 5.

Furthermore as shown in FIG. 1, a board member 19 and a collecting case 20 are provided so as to sandwich the anode plate 14 on the opposite area to the rotary shaft 15 viewing from the cathodes 8 . . . As shown in FIG. 5, the board member 19 is fixed on the upper wall 1b of the base housing 1. This board member 19 is made of a conductive spring material such as a beryllium steel, phosphor bronze, and new silver. As shown in FIG. 6, this board member 19 is disposed to be bent between the upper wall 1b and the anode plate 14, The contact part of the board member 19 to the anode plate 14 is sharpened, and this sharp edge presses the surface of the anode plate 14 by a specific elastic force of the board member 19.

Thus, the depositions on the surface of the anode plate 14 can be raked off by the board member 19 with the rotation of the anode plate 14. And, the raked-off depositions, particles, drop down through the openings 17 . . . of the anode plate 14, and are collected by the foregoing collecting case 20 provided underneath the anode plate 14.

Suppose that, in the metal ion plasma generator in the aforementioned construction, the operation starts in the state that the first hole set S1 is positioned at the discharge area. That is, the evacuation of the vacuum chamber 5 starts through the foregoing processing apparatus, and when the chamber 5 reaches a specific degree of vacuum, a high pulse voltage is applied to each trigger ring 12 through each trigger electrode 13, Thereby, a trigger discharge is generated between the trigger ring 12 and the cathode 8 overpassing the insulating ring 11. At this moment applying a specific voltage between the anode plate 14 and the cathode 8 will induce a vacuum-arc discharge therebetween using the trigger discharge as a starter. This vacuum-arc discharge produces a spot called arc spot where energy concentrates locally. The substance in this spot vaporizes and ionizes to produce a metal ion plasma. Thus, a metal vapor with a high ionization rate is produced.

Conducting such an operation at each cathode 8 simultaneously or periodically sequentially will produce a uniform metal ion plasma across the entire discharge areas. The metal ion plasma is supplied to the aforementioned processing apparatus 6 through each of the openings 17 . . . of the first hole set S1 in the anode plate 14.

If this processing apparatus is a thin film forming apparatus, the foregoing metal ion plasma is supplied to a substrate disposed inside the processing apparatus 6. If, on the other hand, the processing apparatus is used as a metal ion source, the foregoing metal ion plasma is supplied to an ion pullout electrode provided inside the processing apparatus 6.

Continuing the foregoing operation will gradually deposit a part of the metal ions flowing through the openings 17 . . . of the first hole set S1 as metal films on the edges of openings 17 . . . , As this deposition increases, the passing rate of the metal ions through the openings decreases due to the decrease of the diameter of the openings 17 . . . , thus decreasing the performance of the arc source.

The foregoing apparatus thereat stops applying the pulse voltage to the trigger ring 12 after an appropriate time from the start of the operation, pauses the vacuum-arc discharge, and operates the aforementioned drive mechanism 16 to turn the anode plate 14 by 45°. Thereby, the first hole set S1 is switched to the second hole set S2 and each of the openings 17 . . . of the second hole set S2 appears on the discharge area. And, a high pulse voltage is applied to the trigger ring 12 to resume a vacuum-arc discharge, Thereby, a metal ion plasma flows through new openings 17 . . . where metal films are not yet deposited; and a good operation can be resumed with the initial performance of the arc source.

Thus, rotating the anode plate 14 repeatedly at appropriate intervals can continue a longer operation to prevent the lowering of the performance to a high degree due to the deposition of metal films on the openings 17 . . .

Further in the foregoing apparatus, when, for example, metal films are deposited on the edges of the openings 17 . . . of the first hole set S1 and the first hole set S1 passes the position of the foregoing board member 19 with the rotation of the anode plate 14, the board member 19 will rake off the depositions projected upward from the upper surface of the anode plate 14, as shown in FIG. 6. Thereby, the metal films Mf are peeled off from the edges of the openings 17 . . . and drop down as particles through the openings 17 . . . The particles are collected in the collecting case 20.

Thus, metal films deposited on the hole set through the discharge area can be removed almost completely by the board member 19 while the anode plate 14 makes one turn. Therefore, the hole set once used can be reused in a state with a substantially initial performance to be set at the discharge area. Thus, the same hole set can be used in multiple times with maintaining the vacuum state, enabling a further longer continuous operation.

Moreover, since the foregoing board member 19 is made of a conductive material, a good electrical connection is given through the foregoing board member between the anode plate 14 and the base housing 1 functioning as an anode flange for supplying a power source to this anode plate 14. That is, when the anode plate 14 is a rotary type as above, the power is supplied to the anode plate 14 from outside through the base housing 1 supporting the rotary shaft 15 and the rotary shaft 15 itself. In the aforementioned construction, the electrical connection between the anode plate 14 and the base housing 1 is strengthened by the foregoing board member 19 in addition to the rotary shaft 15; and therefore, the anode plate 14 and the base housing 1 are reliably maintained in the same potential, thereby an operation can be performed which electrical losses between the anode plate 14 and the base housing 1 are well reduced.

Further, when the cathodes 8 . . . consume by a continuous operation as mentioned above, the aforementioned cathode drive unit 7 moves these cathodes 8 . . . appropriately in the axial direction. Thereby, the edge surfaces of the cathodes 8 . . . each are maintained to be virtually flush with those of the insulating rings 11 and the trigger rings 12.

Figure 7:
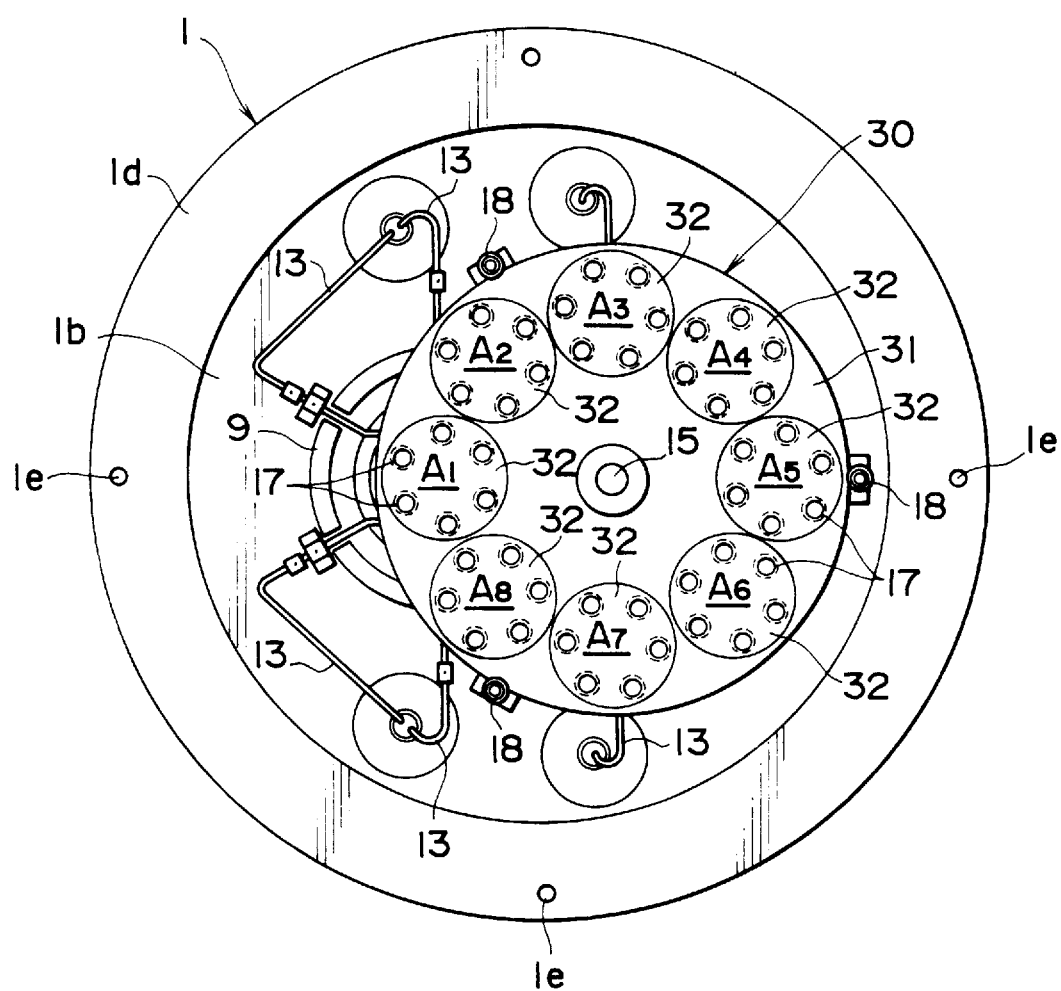
FIG. 7 is a plan view viewing from the bottom, showing an inner construction of the metal ion plasma generator in another embodiment according to the present invention.
Figure 8:
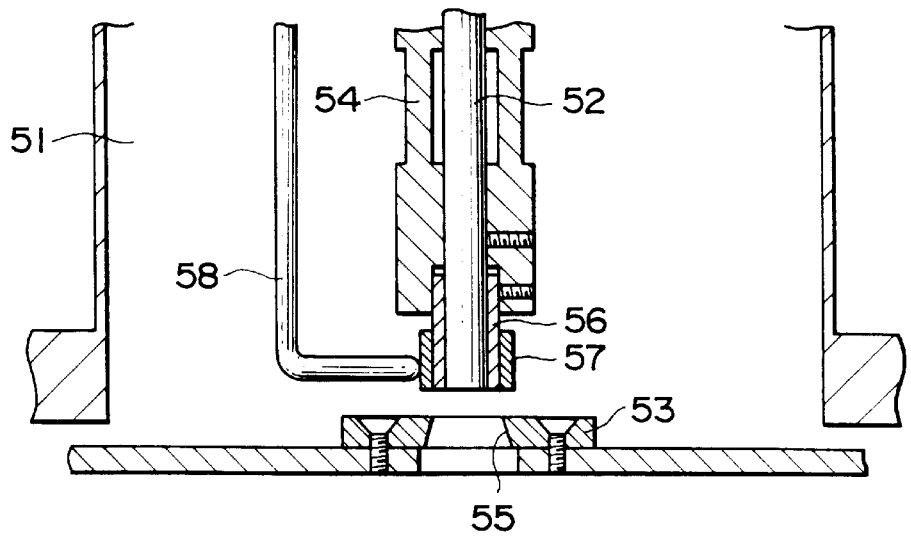
FIG. 8 is a sectional view showing a major construction in a conventional metal ion plasma generator.
Figure 9A:
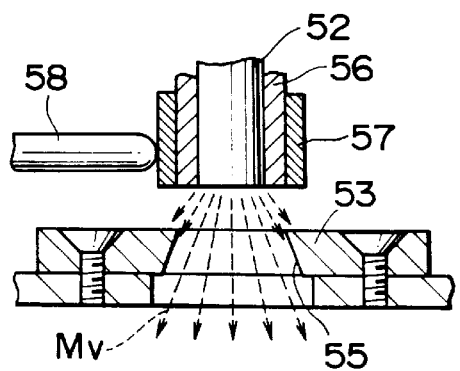
FIG. 9(a) is a partial sectional view showing an initial state of operation.
Figure 9B:
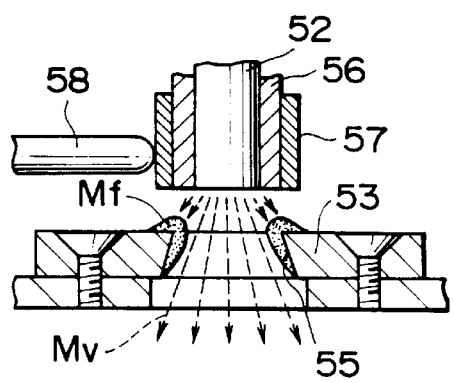
FIG. 9(b) is a partial sectional view showing a state that metal films are deposited on an opening of the anode plate.
Figure 9C:
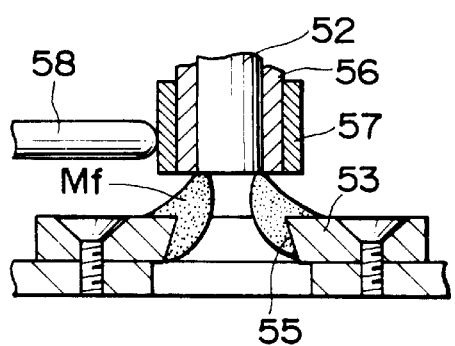
FIG. 9(c) is a partial sectional view showing a state that the anode plate and the cathode are short-circuited.

FIG. 7 shows an internal construction of the metal ion plasma generator in another embodiment of the present invention. The construction of this apparatus is identical to the aforementioned embodiment except that an anode plate 30 is composed of a body plate 31 fixed to the rotary axis 15 and six bored plates 32 . . . each screwed on the body plate 31, and that the anode plate 14 in the foregoing embodiment is replaced with this anode plate 30.

The foregoing bored plates 32 . . . each are formed in a disc-form with a smaller diameter, and six openings 17 . . . are formed on each of the bored plates 32 . . . The body plate 31 is formed with a virtually identical diameter to that of the anode plate 14 in the foregoing embodiment. This body plate 31 is provided with the foregoing areas A1~A8 on the periphery. The forgoing bored plates 32 . . . each are screwed so as to cover the areas A1~A8.

This construction does not require to take out the entire anode plate 30 from the vacuum chamber 5, but it only needs to remove a smaller bored plate 32 from the body plate 31, even when metal films increase on the edges of the openings 17 . . . after the foregoing board member 19 rakes off the depositions and a maintenance work becomes necessary.

Furthermore, to prepare surplus bored plates 32 and exchange a used bored plate for a new one will eliminate a work to remove the metal depositions mechanically by a grinder or the like, thereby improving workability.

The foregoing embodiments should not be considered to limit the present invention, and various modifications and changes can be made within the scope of the present invention. In the foregoing embodiment, an apparatus with six cathodes 8 in the vacuum chamber 5 was described as one example. However, the number of the cathode is optional, and multiple cathodes or one cathode can be applied to the apparatus according to the present invention.

And in the foregoing embodiment, the board member 19 and the collecting case 20 was described to sandwich the anode plate 14 which is placed virtually horizontally. However, the metal ion plasma generator can be connected to the processing apparatus 6 such that the anode plate 14 is placed vertically. In this case, particles raked off by the board member 19 drop down along the surface of the anode plate 14. Therefore in this case, the layout of the collecting case 20 may be changed at an appropriate position along the circumference of the anode plate 14.

As described above, in the metal ion plasma generator according to the present invention, the rotary anode plate is provided in the vacuum chamber, and the anode plate is rotated from outside such that a plurality of openings formed on the anode plate each come into positions facing to cathodes sequentially. Therefore, when metal films deposit on the edges of the openings facing to the cathodes as the operation continues, rotating the anode plate can bring new openings and resume the supply of metal ion plasma through the openings without metal films deposited. This operation can be repeated as many times as the number of the openings on a circumference, and a long operation can be continued with an extremely low deterioration of the performance without a maintenance work requiring a relief of the vacuum.

And, the foregoing anode plate is composed of the body plate attached inside the vacuum chamber and the bored plates detachable to the body plate. In such a construction, it is not necessary to take out the entire anode plate, but a smaller bored plate is only needed to be removed from the body plate when a maintenance work for cleaning the metal films deposited on the edges of the openings is needed. Further, preparing surplus bored plates and exchanging the used for a new one can spare a cleaning work to remove deposited metal films mechanically by a grinder or the like, thereby improving work efficiency.

Furthermore, if a board member is provided on the locus on which the openings move with the rotation of the anode plate, so as to come into contact with the surface of the anode plate; when an opening turns to cross the board member, the board member rakes off metal films deposited on the periphery of the opening. Thereby, the openings where metal films are once formed can be reused. Consequently, a still longer operation can be continued.

Furthermore, if the aforementioned board member is formed of a conductive elastic material, and is attached to an anode flange enclosing the vacuum chamber so as to face the anode plate, attaching the foregoing board member with an elastic deformation so as to induce a pressing force to the surface of the anode plate will ensure the raking-off described above. Moreover, since the foregoing board member has conductivity, a good electrical contact is given between the anode plate and the anode flange through this board member, which enables an operation that electrical losses between the anode plate and the anode flange are sufficiently reduced.

And, if a collecting case for collecting particles removed from the surface of the anode plate is provided on a position in a dropping direction of the particles, the collecting case can prevent metal particles raked off by the board member from flying about in the vacuum chamber. This facilitates the maintenance work to clean the vacuum chamber, thereby improving the workability.

While specific embodiments of the present invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A metal ion plasma generator in which a vacuum-arc discharge is generated inside a vacuum chamber between a metal cathode and an anode plate and an evaporated substance from the cathode is supplied through an opening on the anode plate located at a position facing to the cathode, wherein:

said anode plate is rotary;

a plurality of openings are formed on a circumference of the anode plate so as to be concentric with the rotary axis of the anode plate; and a rotation driving means for rotating the anode plate from outside of the vacuum chamber is provided so as to sequentially locate these openings to a position facing to the cathode with the rotation of the anode plate.

2. A metal ion plasma generator as claimed in claim 1, wherein, said anode plate is comprised of a body plate rotatably attached to the vacuum chamber and a bored plate detachable from the body plate, and said openings are formed on the bored plate.

3. A metal ion plasma generator as claimed in claim 1 or 2, wherein a board member is provided on the locus on which the openings move with the rotation of the anode plate, so as to come into contact with the surface of the anode plate.

4. A metal ion plasma generator as claimed in claim 3, wherein said board member is formed of an elastic material having conductivity, electrically connected to the anode plate, and one end of the board member is attached to an anode flange facing to the anode plate and enclosing the vacuum chamber.

5. A metal ion plasma generator as claimed in claim 3, wherein a collecting case for collecting particles removed by the board member from the surface of the anode plate is provided on a position in a dropping direction of the particles.

* * * * *